United States Patent
Nemir et al.

(10) Patent No.: US 7,366,622 B1
(45) Date of Patent: Apr. 29, 2008

(54) ARC FAULT IDENTIFICATION USING MODEL REFERENCE ESTIMATION

(75) Inventors: David C. Nemir, El Paso, TX (US); Jan B. Beck, El Paso, TX (US)

(73) Assignee: X-L Synergy, El Paso, TX (US)

( * ) Notice: Subject to any disclaimer, the term of this patent is extended or adjusted under 35 U.S.C. 154(b) by 0 days.

(21) Appl. No.: 11/252,404

(22) Filed: Oct. 17, 2005

(51) Int. Cl.
G01R 15/00 (2006.01)
G06F 17/00 (2006.01)

(52) U.S. Cl. .................. 702/58; 702/59; 702/185; 703/4; 361/2

(58) Field of Classification Search ........... 702/58, 702/59
See application file for complete search history.

(56) References Cited

U.S. PATENT DOCUMENTS

| | | | |
|---|---|---|---|
| 4,812,995 A * | 3/1989 | Girgis et al. ............. 700/292 |
| 5,047,724 A | 9/1991 | Boksiner et al. |
| 5,359,293 A | 10/1994 | Boksiner et al. |
| 5,452,223 A | 9/1995 | Zuercher et al. |
| 5,561,605 A | 10/1996 | Zuercher et al. |
| 5,578,931 A * | 11/1996 | Russell et al. ............. 324/536 |
| 5,659,453 A * | 8/1997 | Russell et al. ............. 361/93.1 |
| 5,682,101 A | 10/1997 | Brooks et al. |
| 5,691,869 A | 11/1997 | Engel et al. |
| 5,706,159 A | 1/1998 | Dollar, II et al. |
| 5,805,397 A | 9/1998 | MacKenzie |
| 5,839,092 A | 11/1998 | Erger et al. |
| 5,933,305 A | 8/1999 | Schmalz et al. |
| 5,963,406 A | 10/1999 | Neiger et al. |
| 5,973,896 A * | 10/1999 | Hirsh et al. ............. 361/54 |
| 6,198,611 B1 | 3/2001 | Macbeth |
| 6,242,922 B1 | 6/2001 | Daum et al. |
| 6,362,629 B1 | 3/2002 | Parker et al. |
| 6,377,427 B1 | 4/2002 | Haun et al. |
| 6,522,509 B1 | 2/2003 | Engel et al. |
| 6,532,424 B1 | 3/2003 | Haun et al. |
| 6,577,138 B2 | 6/2003 | Zuercher et al. |
| 6,629,044 B1 * | 9/2003 | Papallo et al. ............. 702/60 |
| 6,654,220 B2 | 11/2003 | Stanimirov et al. |
| 6,747,457 B2 | 6/2004 | Suzuki |
| 6,751,528 B1 | 6/2004 | Dougherty |
| 7,003,435 B2 * | 2/2006 | Kolker et al. ............. 702/185 |
| 2003/0227290 A1 | 12/2003 | Parker |
| 2004/0253489 A1 * | 12/2004 | Horgan et al. ............. 429/13 |

* cited by examiner

*Primary Examiner*—Hal D Wachsman
(74) *Attorney, Agent, or Firm*—Jeffrey D. Myers; Samantha Updegraff; Peacock Myers, P.C.

(57) ABSTRACT

An apparatus and method for the identification of arcing phenomena in a faulted electrical network. By continually updating a model for the load on an electrical branch, an estimate of the behavior of that load may be calculated. Since electrical arcing faults result in a chaotic behavior that is difficult to describe, when arcing occurs, the model will be unable to adequately describe the arcing behavior and this inability indicates a fault condition, in response to which, power may be removed in full or in part from the faulted electrical network. In some embodiments, a current shunt is used to distinguish between source side and load side arcing. Some embodiments utilize a solid state switch as both current shunt and interruption means.

14 Claims, 15 Drawing Sheets

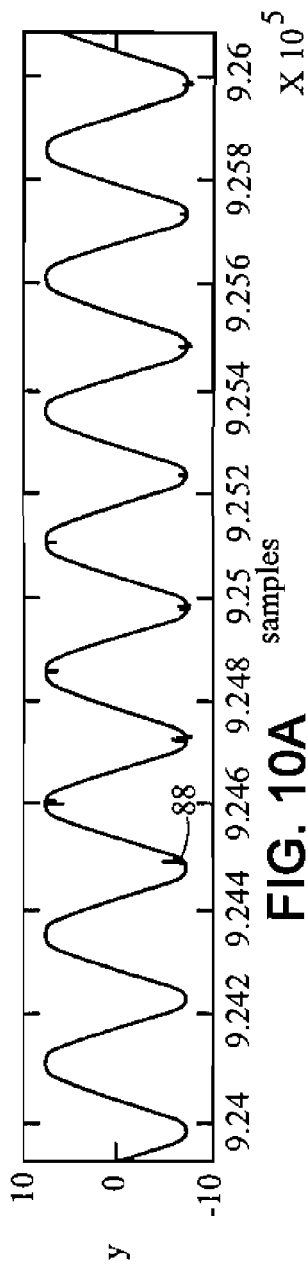
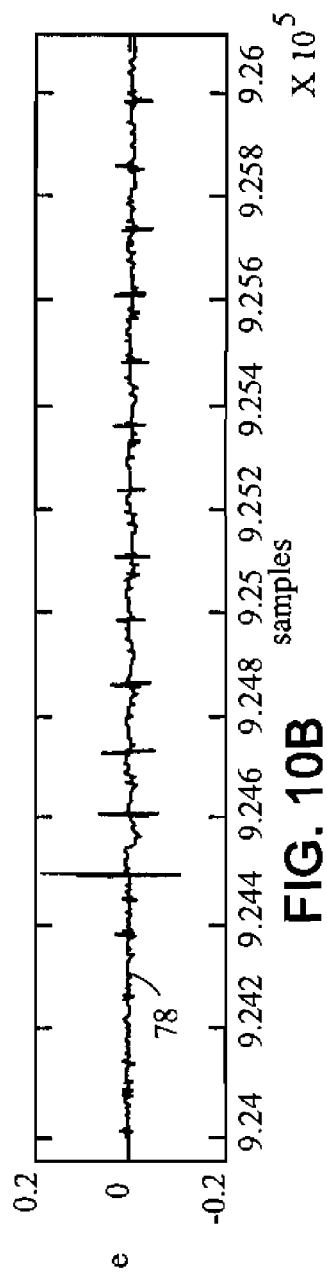
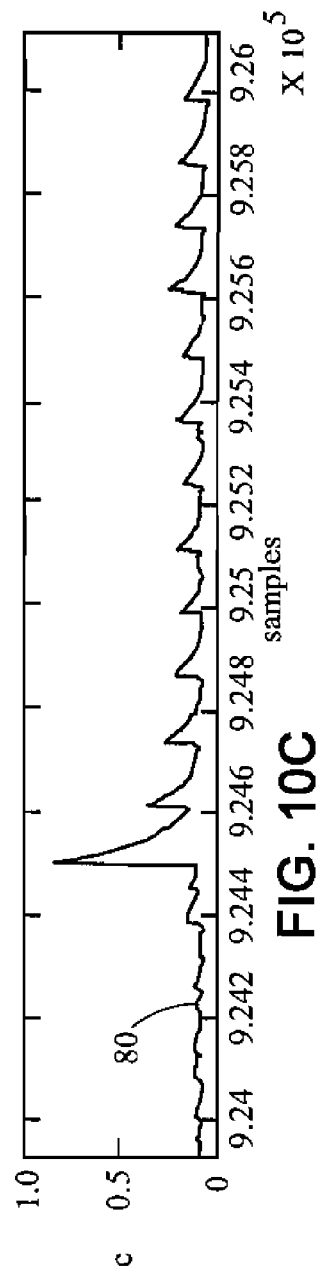
FIG. 10A
FIG. 10B
FIG. 10C

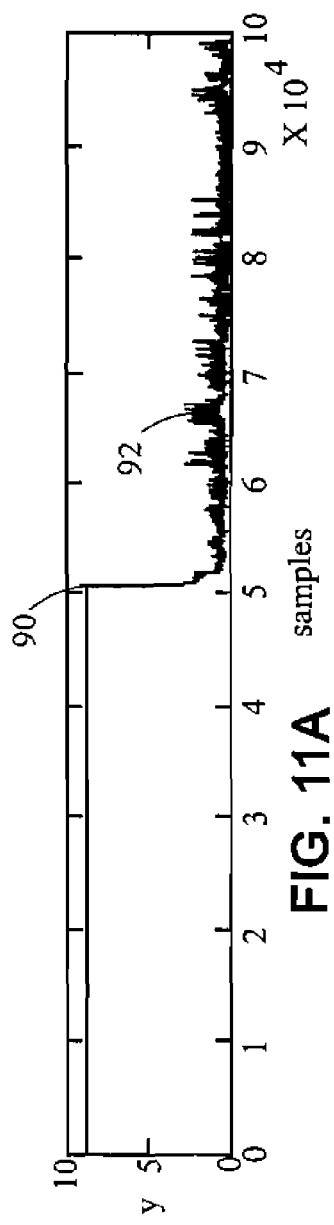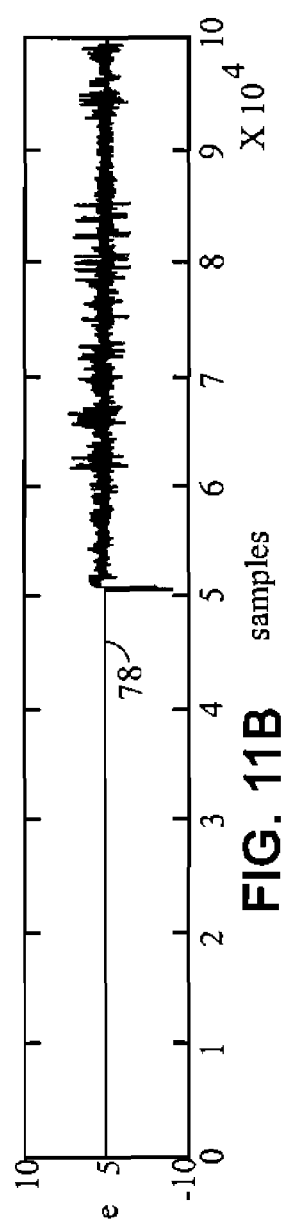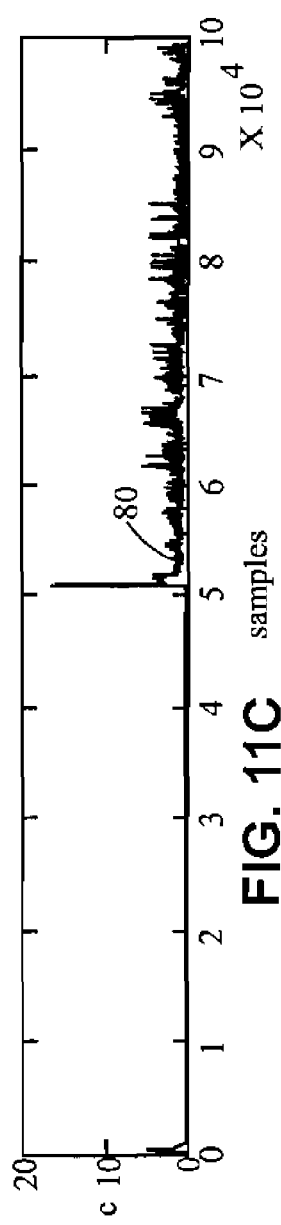

ARC FAULT IDENTIFICATION USING MODEL REFERENCE ESTIMATION

STATEMENT REGARDING FEDERALLY SPONSORED RESEARCH OR DEVELOPMENT

This invention was supported in part by the United States Air Force Research Laboratory under contract FA8650-04-C-2488.

INCORPORATION BY REFERENCE OF MATERIAL SUBMITTED ON A COMPACT DISC

Not Applicable.

COPYRIGHTED MATERIAL

Not Applicable.

BACKGROUND OF THE INVENTION

Field of the Invention (Technical Field)

The present invention relates to an apparatus and method for quickly identifying an electrical arc fault condition in the wires of an electrical distribution system through the use of real time system identification coupled with model reference estimation.

BRIEF SUMMARY OF THE INVENTION

The present invention is of an apparatus and method for the rapid identification of arcing phenomena in a faulted electrical network. By continually updating a model for the load on an electrical branch, an estimate of the behavior of that load may be calculated. Since electrical arcing faults result in a chaotic behavior that is complicated to describe, when arcing occurs, the model will be unable to adequately describe the arcing behavior and this inability indicates a fault condition, in response to which, power may be removed in full or in part from the faulted electrical network. In some embodiments a current shunt is used to distinguish between source side and load side arcing.

Description of Related Art

Arc faults in electrical systems are a significant source of damage that cannot be addressed by conventional circuit breaker technology. In an aircraft, such faults can arise from causes as diverse as combat damage, insulation aging, loose connections or damage to electrical wires that can occur during routine maintenance. In a home, arcing faults can occur when insulation ages, when insulation is damaged by insects or rodents, or can be due to a variety of other causes. Vibration can chafe insulation as wires rub against each other, against tie downs or against structural members. Maintenance can be hard on wires as wires become nicked by worker's pliers or are pulled through narrow bending radii. Stresses due to thermal and air pressure cycling can prematurely age wire insulation. Condensation and exposure to salt air can create "tracks" where conductive traces are formed. Over time, contaminants can degrade the insulation and penetrate into insulation cracks.

Whenever there is a luminous discharge (a spark) between two conductors or from one conductor to ground, this is termed as an arcing or arc fault and is objectionable because heat is produced as a byproduct of this unintentional electrical path. If not immediately detected and interrupted, an arcing fault can quickly lead to high heat electrical fires that can involve other wires, compromising the function of multiple electrical control and/or power circuits. The heat of an electrical arc can cause the ignition of combustible materials and is a leading cause of electrical fires.

Arc faults may be broadly characterized as either series or parallel. A series arc fault can occur when one of the current carrying paths in series with the load is unintentionally broken. A series arc fault can also occur when a series connection of two conductors is loose, intermittent or compromised by oxidation, dirt or other contaminants. A parallel arc fault occurs when two distinct conductors, having a different potential, are brought into close proximity or direct contact. Although an electrical arc is thought of as a light and heat producing event, it is possible to have low level, but undesirable, electrical leakages between conductors, that, if left unattended, can develop into higher current, high heat arcs. This is sometimes referred to as tracking.

Arcs are distinguished by several features. First, when an arcing path is struck, this causes a discontinuity in the current flow in power conductors. For alternating current, this arc strike can occur each half cycle as the voltage builds until it reaches a value high enough to support current flow across an air gap. As the voltage goes through a zero crossing, the arc is extinguished since there is not sufficient voltage potential to support electrical current flow. When an arc strikes, it may cause a chaotic current flow across a heat generated plasma path which can be detected in the frequency domain as an event having broadband frequency content. So, periodic strikes are one characteristic of arcs in an AC system and chaotic or broadband frequency content is characteristic of both AC and DC system arcs. The majority of the technologies that have been proposed for arc fault management are based upon an electrical signal analysis of signals taken from power delivery conductors and rely upon (1) a detection of the characteristic broadband frequency content of an arcing fault; (2) the rapid change in currents (di/dt) characteristic of sudden arc current flow; (3) repetitive strikes during characteristic times in the AC waveform; and/or (4) a comparison of electrical current profiles in successive half cycles in search of a pattern characteristic of arcing. Virtually all of these proposed technologies combine arc detection with a latched arc interruption to remove power from a faulted electrical branch upon detection of an electrical arcing fault.

U.S. Pat. Nos. 5,047,724 and 5,359,293 (Boksiner et al.) disclose a method for deriving a frequency domain spectrum from the time domain signals and then evaluating the higher frequency components in order to determine the presence of an electrical arc.

U.S. Pat. Nos. 5,452,223 and 5,561,605 (Zuercher et al.) disclose an arc detection apparatus for AC systems that analyzes some preset number of cycles of AC waveform for intercycle deviations to generate an arc indicative signal. U.S. Pat. No. 5,933,305 (Schmalz et al.) discloses an arc fault detector that develops a signal proportional to the load current, filters out the fundamental frequency and then compares the resulting current to that derived from previous cycles to detect changes characteristic of an arcing fault. U.S. Pat. No. 6,522,509 (Engel et al.) analyzes the absolute magnitudes of successive current cycles to identify behavior characteristic of an arcing fault. U.S. Patent Application Publication No. US 2003/0227290 A1 (Parker) describes an arc fault detection technique that relies upon the comparison of the waveform of an AC supply with the waveform profiles from previous half cycles in order to identify differences said to be characteristic of an arcing event.

U.S. Pat. No. 5,578,931 (Russell et al.) describes the use of spectral analysis to determine whether an arc is present. By developing a frequency spectrum of the load current and then comparing it to a frequency spectrum that is typical of an arc event, an arc event is said to be identifiable.

U.S. Pat. No. 5,682,101 (Brooks et al.) describes an arc detection approach that monitors the rate of change of electrical currents in the power line. This derivative information is amplified and processed to generate a signal that is said to be indicative of an arcing event.

U.S. Pat. No. 5,706,159 (Dollar et al.) discloses an arc detector that filters the signals derived from a current sensor and detects when the magnitude of certain high frequency components, said to be characteristic of an arc, exceed some threshold.

U.S. Pat. No. 5,805,397 (MacKenzie) describes a multi-channel arc fault detector in which each channel includes a bandpass filter having a unique, nonoverlapping passband. If all filters simultaneously have an output exceeding a certain threshold, this is said to be indicative of the white noise generated by an arc fault. U.S. Pat. Nos. 6,377,427 and 6,532,424 (Haun et al.) disclose a arc fault sensing circuit that sums the output of a set of bandpass filters to determine the amount of broadband noise in a load side circuit. Since arcing faults produce broadband noise, this approach purports to accurately identify arcing faults. U.S. Pat. No. 6,577,138 (Zuercher et al.) discloses an arc detection technique that requires the bandpass filtering of a current proportional signal. By integrating the filtered signal over repetitive intervals an arc proportional signal is said to be derived that can be compared against target thresholds.

U.S. Pat. No. 5,839,092 (Erger et al.) describes an arc detection system that compares load current slopes and magnitudes in successive half cycles in an alternating current system in order to detect the presence of a fault. U.S. Pat. No. 6,198,611 (Macbeth) utilizes the di/dt signal from a current sense transformer to detect the high rates of change characteristic of arc strikes.

U.S. Pat. No. 5,963,406 (Neiger et al.) describes the use of line side and load side "pick-up" coils. The signal from each such coil is filtered and frequencies are analyzed to detect the presence of an arcing fault with the larger signal said to indicate the fault location relative to the sensor.

U.S. Pat. No. 6,242,922 (Daum et al.) describes an AC arc detection approach whereby the signal from a current sensor is filtered to remove the line frequency component and then is analyzed for the higher frequencies characteristic of an arcing fault.

U.S. Pat. Nos. 6,362,629 and 6,747,459 (Parker et al.) disclose a technique for arc detection by filtering a signal that is proportional to current and then comparing the frequency to a known arc signature spectrum. The use of fractal subsets is said to enhance arc detection reliability.

U.S. Pat. No. 6,654,220 (Stanimirov et al.) describes a method for detecting faulted electric power lines, particularly short circuits, by taking measurements of voltages and currents over measurement windows (sets of data), calculating a load impedance, and switching off the line if the impedance value meets a certain criteria. The detection of radio frequency noise is used to adjust the length of the measurement window.

U.S. Pat. No. 5,691,869 (Engel et al.) discloses an arc detection technique which is based upon the sensing of a repetitive strike, said to be indicative of an arcing fault. Such a technique requires multiple cycles of arcing before an arc is recognized.

U.S. Pat. No. 6,751,528 (Dougherty) describes an arc detection technology that is based upon taking the discrete Fourier transform of a current signal. An expert arc algorithm is said to be able to determine the presence of an arc from examination of even and odd harmonic frequency components.

SUMMARY OF THE INVENTION

The present invention is of an apparatus and method for the remote detection of electrical arcing in an electrical power delivery branch. An autoregressive time domain model is assumed for the branch. By continually updating this model in real time, an estimate for the behavior of the load on the electrical branch may be determined. Typical loads are easy to describe by a second order time domain model. However, if an electrical arcing fault occurs, this is complicated behavior that is not easy to describe and the model will not adequately describe the behavior of the load. The mismatch between expected and measured load behavior is recognized as an arc fault and a circuit interrupter can then be used to remove power from the faulted electrical branch.

Electrical loads exhibit a wide ranging set of behaviors. For example, in a constant resistance load, the voltage across the load will be proportional to the current through the load. The equation describing such a system is known as a zeroeth order equation. In more complicated loads having one or more energy storage elements such as inductors or capacitors, the circuit behavior can usually be described by first or second order differential equations. Even if the system is of relatively high order, its transient response is generally dominated by elements having first or second order dynamics. An example of such loads is a switching power supply. Loads such as an incandescent light have a variable resistance. Initially, the bulb filament is cold and has a relatively low value. This causes high current inrush when the lamp is first turned on. As the filament heats up, its resistance goes up to a steady state value and the initial high voltage transient dies out to leave a zeroth order, constant resistance, steady state response. Dimmer circuits that operate by controlling the phase of a lamp use solid state switching elements and are highly nonlinear. However, in steady state, the overall load characteristic of these devices is largely second order with frequency components that are multiples of the fundamental forcing function.

Electrical loads are continuous in nature, that is, they have a voltage and current relationship that is continuously variable over time. Models for these loads may be continuous or discrete. When carrying out system identification, it is much easier to use discrete models for load characterization since discrete models may be implemented using discrete circuits operating upon sampled data. There are a variety of models that have been proposed to represent electrical loads. These range from nonparametric models such as a graph of the response, to parametric models which are models that have a finite set of parameters that embody key characteristics of the load. An important class of discrete models is known as autoregressive models. These represent the system output as a function of past values of outputs and present and past values of inputs.

Given a set of discrete input and output measurements from a system, an autoregressive model would take the form $$y_k = a_1 y_{k-1} + a_2 y_{k-2} + \ldots + a_m y_{k-m} + b_1 u_{k-1} + \ldots + b_l u_{k-l} \qquad (1)$$

where $y_k$ and $u_k$ are the output and input sequences respectively. An equation having the form of equation (1) is known as an ARX(m,l) model since it has m autoregressive terms and/exogeneous (or input) terms.

An ARX(m,l) model is completely defined by the knowledge of the constant coefficients $(a_1, a_2, \ldots a_m, b_1, \ldots b_l)$. When these coefficients are not known, they must be estimated. Define a vector of model coefficients as $$\Theta = col(a_1, \ldots a_m, b_1, \ldots b_l) \quad (2)$$

and a vector of measurements as $$M_k = col(y_{k-1}, y_{k-2}, \ldots y_{k-m}, u_{k-1}, \ldots u_{k-l}). \quad (3)$$

Then equation (1) can be written in vector form as $$y_k = M_k^T \Theta \quad (4)$$

For a given system, if the order of an ARX model is assumed, then the task of identifying the best model that fits the system is one of identifying the parameters $\Theta$. If the goal is to carry out real time parameter identification, that is, updating the parameter estimate each time that a new measurement set is obtained, then a recursive technique is preferred. Many techniques have been proposed, with various optimality characteristics. Two of the most common are least squares and stochastic approximation. Recursive least squares is optimal in the sense of minimizing the sum of the squared estimation errors. As each set of data points is acquired, this algorithm proceeds in two steps. First, a covariance matrix is updated as $$P_k = [P_{k-1} - P_{k-1} M_k (M_k^T P_{k-1} M_k + 1)^{-1} M_k^T P_{k-1}] \quad (5)$$

where $P_k$ is a square matrix of dimension m+l and the initial value of this matrix is $P_0 = 1000I$ where I is the identity matrix (note that the choice of $P_0$ will depend upon relative magnitudes of the data but should generally be chosen to be a large number). Then the estimate of the parameters for sample k is generated as $$\hat{\Theta}_k = \hat{\Theta}_{k-1} + P_k M_k [y_k - M_k^T \hat{\Theta}_{k-1}]. \quad (6)$$

Equation (6) has a standard form known as a differential corrector. The parameter estimate at time k is calculated as the previous estimate plus a correction term which is proportional to the error in the estimate which is the bracketed term in equation (6). This bracketed term is a scalar quantity which is also referred to as the residual.

An alternative algorithm for parameter estimation is the stochastic approximation algorithm in which the parameter estimate is updated with each new measurement set according to $$\hat{\Theta}_k = \hat{\Theta}_{k-1} + \mu M_k [y_k - M_k^T \hat{\Theta}_{k-1}] \quad (7)$$

where $\mu$ is a constant and, as before, the term in brackets represents the residual or estimate error.

Prior art inventions are primarily directed at alternating current (AC) power distribution systems, and require faulting through multiple cycles before an arc is detected. Frequency domain based techniques require complicated discrete Fourier transform algorithms which are computationally complex. For many techniques, concerns about nuisance tripping requires rule exceptions and modifications that result in cumbersome algorithms that will be slow to respond for all but the most severe fault conditions. In contrast, the present invention has the following objects and advantages:

a) it is a time domain based technique that does not require windowing;

b) it is based upon identifying the characteristics of an electrical load and is independent of the type of power source. As such, it is applicable to both direct current (DC) and alternating current (AC) systems;

c) it offers robustness to nuisance tripping;

d) it allows the use of sensitive fault detection thresholds; and e) it is easy to implement.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings:

FIGS. 10A-10C depict the data from a non-fault lamp dimmer load;

FIGS. 11A-11C depict the data from a carbonized arc fault when the supply is 270 VDC;

LIST OF REFERENCE NUMERALS

20—Power source
22—Power delivery conductor
23—Power delivery conductor 24—Power delivery conductor
26—Electrical Ground
28—System identifier
30—Ammeter
32—Voltmeter
34—Electrical load
36—Switch 1
38—Switch 2
40—Switch n
42—Load 1
44—Load 2
46—Load n
48—Parallel arc fault
50—Series arc fault
52—Source side node
54—Load side node
56—System
58—Current shunt
60—Analog to digital converter
62—Parameter estimator
64—Node on source side of shunt
66—Node on load side of shunt
68—System model
70—Residual sequence
72—Processor
74—Fault signal
76—Point at which arc fault strikes
78—Residual sequence
80—Processed sequence
82—First sign of leakage across carbonized path
84—Arc strike
86—Switching power supply turns on
88—Lamp dimmer turns on
90—Carbonized fault is added across load side conductors
92—Chaotic fault behavior
94—Control signal
96—Solid state switch
98—Reference for control signal
100—Arc fault circuit interrupter 1
102—Arc fault circuit interrupter 2
104—Source side node for AFCI 1
106—Source side node for AFCI 2
108—Load side node for Load 1
110—Load side node for Load 2
112—Load 1
114—Load 2
116—Circuit common
118—Current sense transformer
120—Node
121—Loading resistor
122—Transformer secondary
124—Circuit breaker
126—Solenoid actuator
128—Control signal
130—Initialization step in algorithm
132—Index increment step in algorithm
134—Data acquisition step
136—Calculation of estimation residual step
138—Update model parameters step
140—Determine process variable step
142—Decision of a fault step
144—Action taken upon fault recognition step

DETAILED DESCRIPTION OF THE INVENTION

The present invention is for a method and apparatus for identifying electrical arcing faults in an electrical branch. When an arcing fault is identified, it may be interrupted, or in some cases, managed, so as to prevent extensive damage to electrical wiring.

Figure 1:
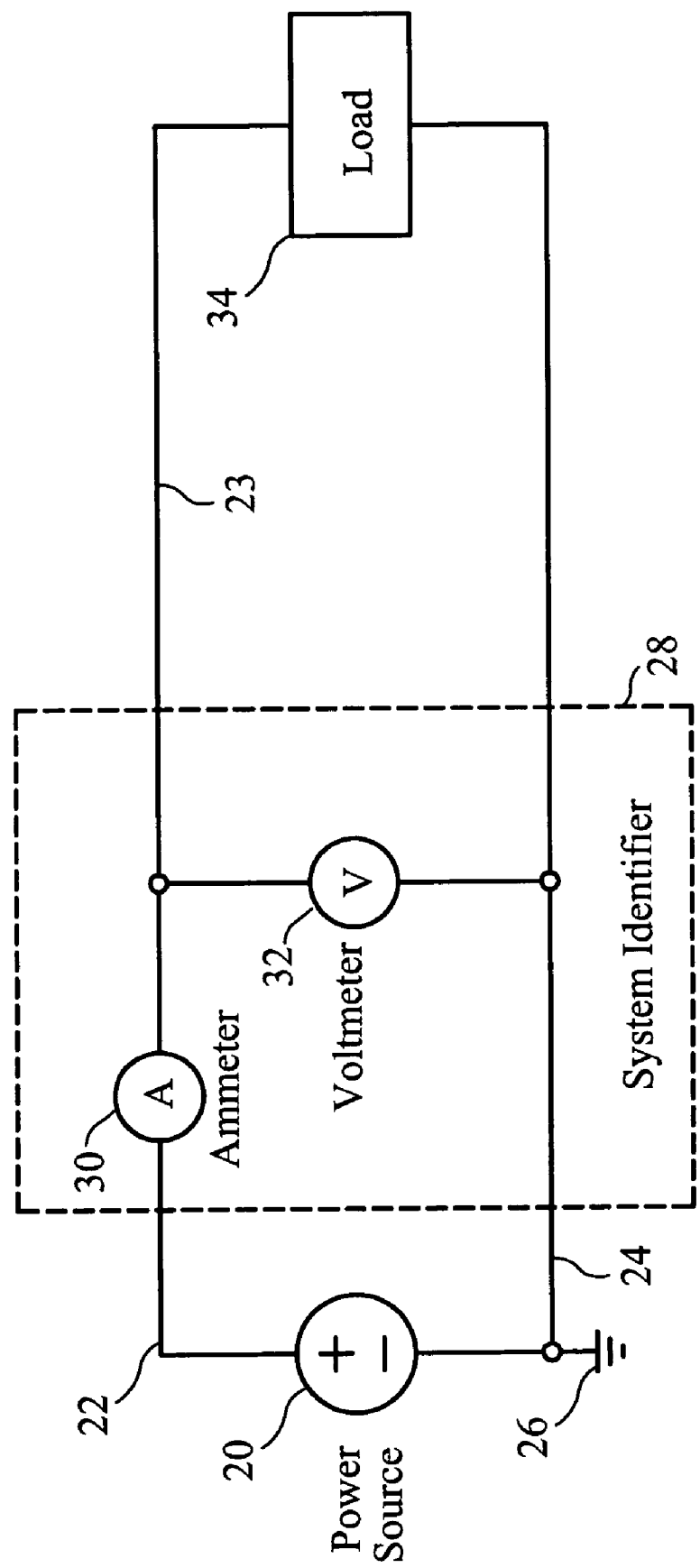
FIG. 1 is a block diagram depicting the identification of a load through measurements of current and voltage.

FIG. 1 depicts the elements needed for the identification of a load on an electrical branch. The electrical branch consists of a power source 20 which may be either direct current (such as a battery or DC power supply) or alternating current. The power source 20 connects to power delivery conductors 22 and 24. Power delivery conductor 24 is shown as connecting to an electrical ground 26 which serves as a point of reference for all voltage measurements. This electrical ground 26 may literally be attached to an earth ground, may be attached to the frame of an aircraft (in an aircraft application) or may simply be a reference point and not electrically attached outside of the circuit. For an alternating current power source, power delivery conductor 22 will sometimes have a positive voltage and will sometimes have a negative voltage as it varies cyclically about the reference voltage at ground 26. Power source 20 delivers electrical power to an electrical load 34. An electrical load 34 is a non power generating element that, when connected into an electrical circuit, exhibits a voltage drop across it and an electrical current flow through it. There are many ways to describe an electrical load 34. For example, in some cases, the load may be adequately described by an electrical schematic consisting of a collection of interconnecting resistors, capacitors, transistors and/or other electrical components. In some cases, the load 34 may be adequately described by a time domain state space model or a frequency domain impedance model. For the general case, we define the load 34 as being completely described by a record of both voltage across the load 34, and current through the load, as a function of time. This record can be obtained by using an ammeter 30 to measure the electrical current passing through the load 34 and a voltmeter 32 to measure the voltage across the load 34. Accordingly, the combination of a voltmeter 32 and ammeter 30 comprise a system identifier 28 that can be used to describe load 34. Since ammeters have very low internal impedance, there is negligible voltage drop across the ammeter 30 and power delivery conductor 23 has the same voltage potential as power delivery conductor 22. Since voltmeters have very high internal impedance, there is negligible current drawn by the voltmeter 32 and so virtually all of the electrical current that goes into load 34 also passes through ammeter 30.

Figure 2:
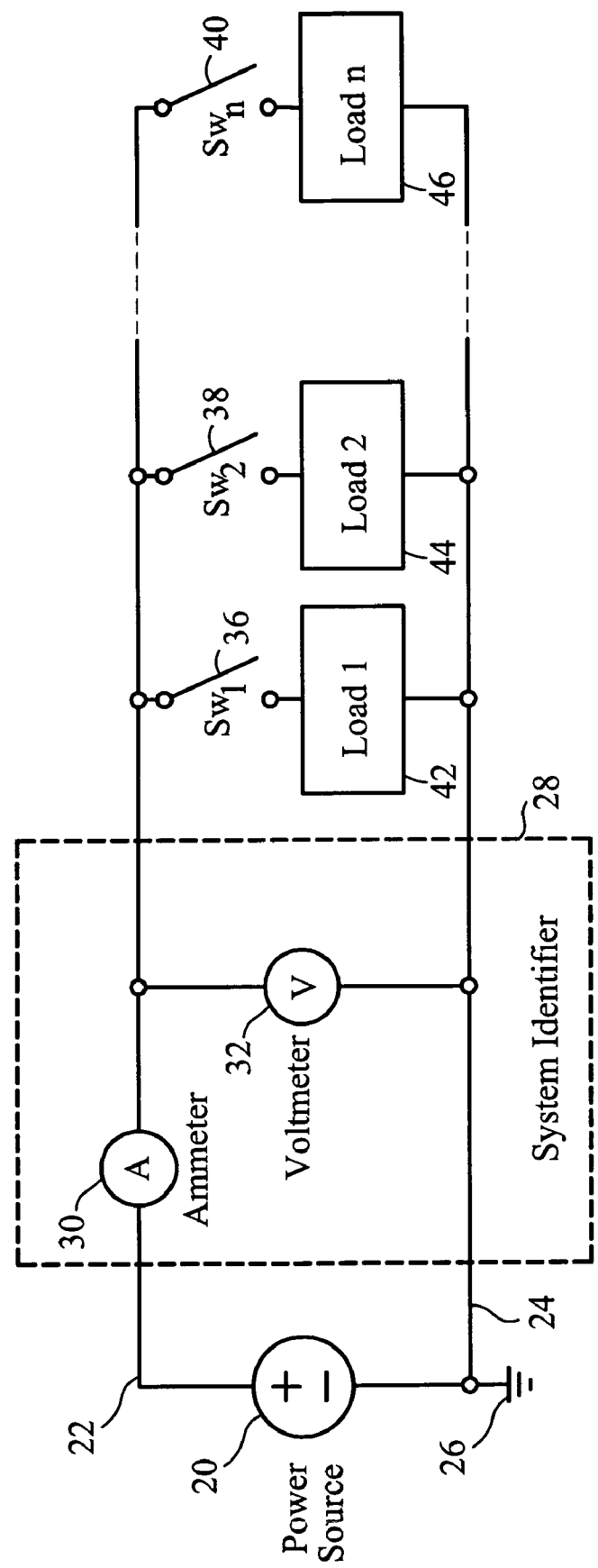
FIG. 2 is a block diagram depicting the system identification problem when multiple loads can be engaged and disengaged.

FIG. 2 depicts the system identification problem when there are an arbitrary number, n, of possible loads that can be switched on or off of an electrical power branch. Switches 36,38 and 40 may be turned on or off at arbitrary times either synchronously or asynchronously. This corresponds to the realistic case where multiple loads receive power from the same source. Since the loads 42,44,46 may be engaged or removed from the system at arbitrary times, the system identifier 28 must be able to accommodate a time varying system. Since frequency domain models, such as load impedance, are not well suited for modeling time varying systems, time domain system models are preferable.

Figure 3:
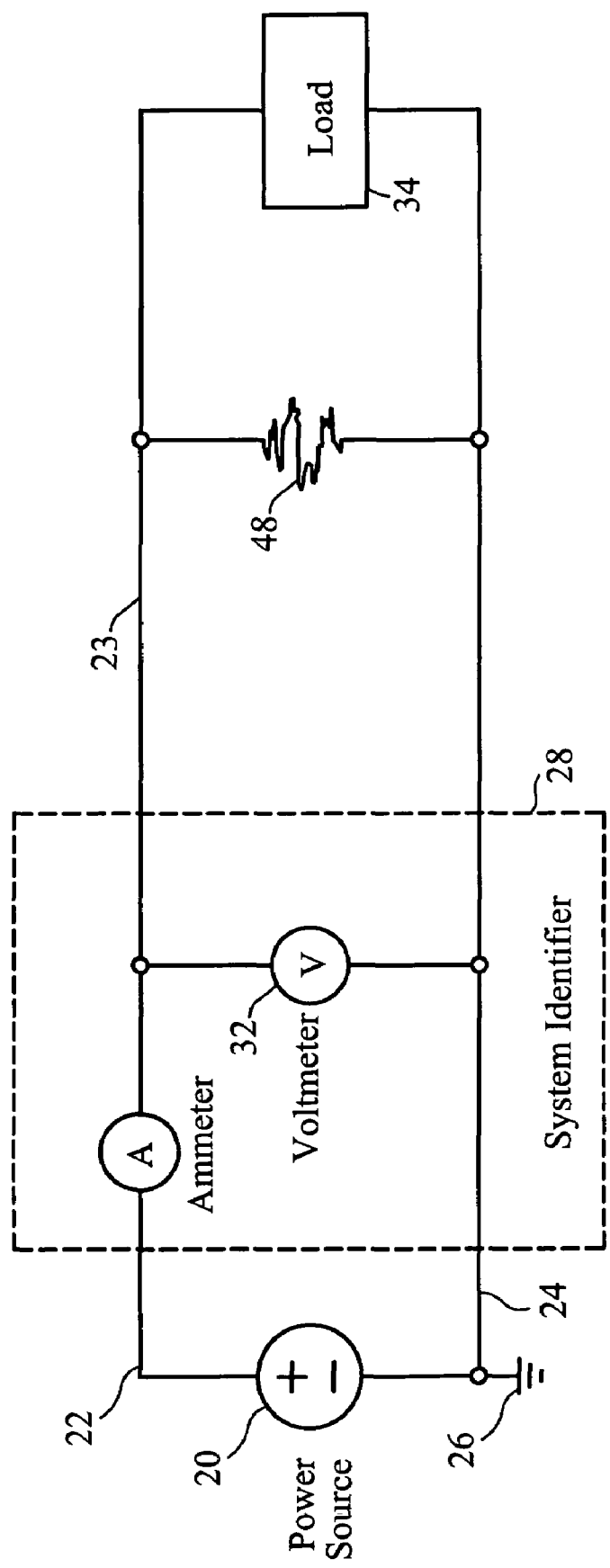
FIG. 3 depicts a parallel arcing fault in an electrical distribution network.

FIG. 3 depicts the case when a parallel arc 48 occurs between power delivery conductors 23 and 24. Parallel arc 48 is a fault condition and the relationship between current and voltage across parallel arc 48 is highly nonlinear when first struck, as a plasma path is established across an air gap.

The behavior of an arc has been described as discontinuous and chaotic in the time domain. Note that an electrical arc must exhibit both a voltage across it and a current through it. If there were no voltage, it would be a short circuit and no heat would be generated in this fault. If there were no current, it would be an open circuit, and again, no heat generated in the fault. Since heat is the troublemaker in an arcing fault, a fault must, by definition, have both a nonzero voltage and a nonzero current. In this sense, a fault acts in many ways like a legitimate load.

Figure 4:
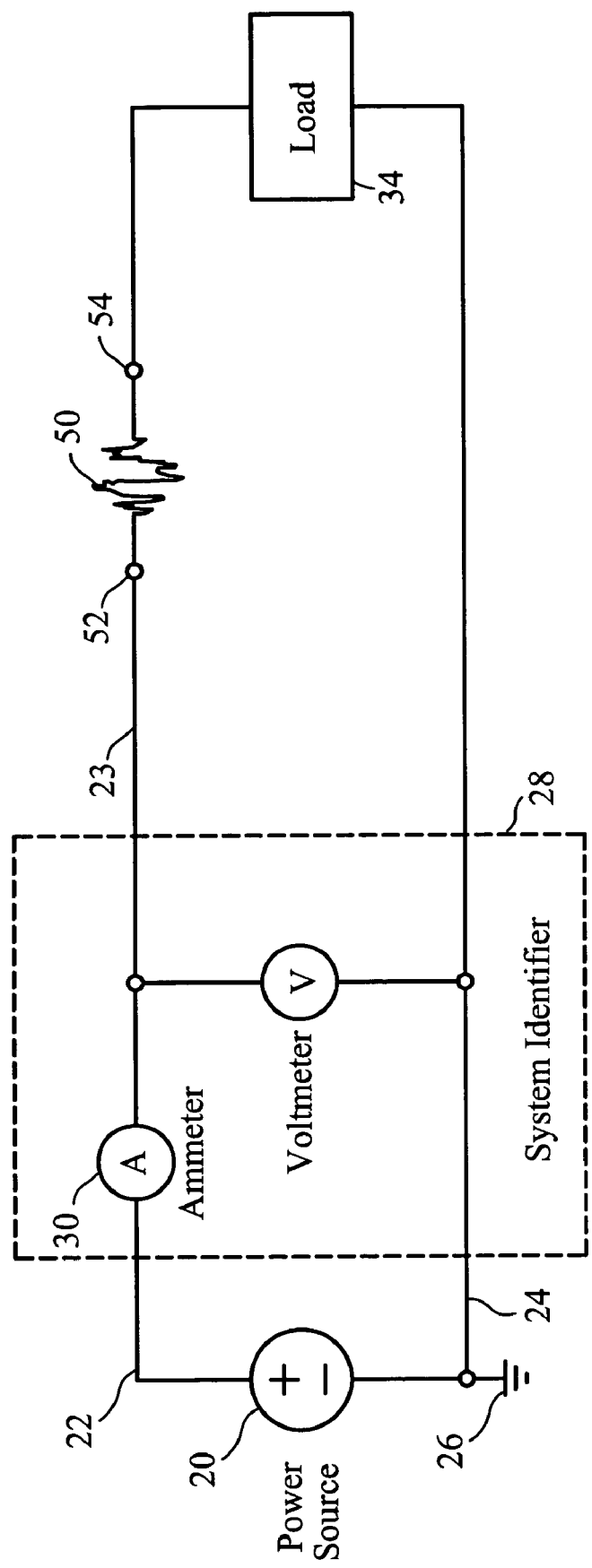
FIG. 4 depicts a series arcing fault in an electrical distribution network.

FIG. 4 depicts the case when a series arc 50 occurs between nodes 52 and 54. This can occur due to a loose connector between nodes 52 and 54 or due to a break somewhere along conductor 23. Because the load 34 serves to limit the amount of current that can flow through the series arc 50, series arcs are often less severe than parallel arcs and this can make them harder to identify.

A comparison of FIG. 3 and FIG. 4 with that of FIG. 2 highlights the challenge of distinguishing a faulted system from a system which is unfaulted but in which various loads may be switched in and out. Both series and parallel arc faults act like loads. They have a nonzero voltage and a nonzero current passes through them. The main distinction between an arc fault and a legitimate load, from the standpoint of remote measurements of voltage and current, is that a fault exhibits chaotic behavior. The chaotic behavior results in the fault being a difficult "load" to model. This is a feature that can be exploited to recognize a fault occurrence.

Figure 5:
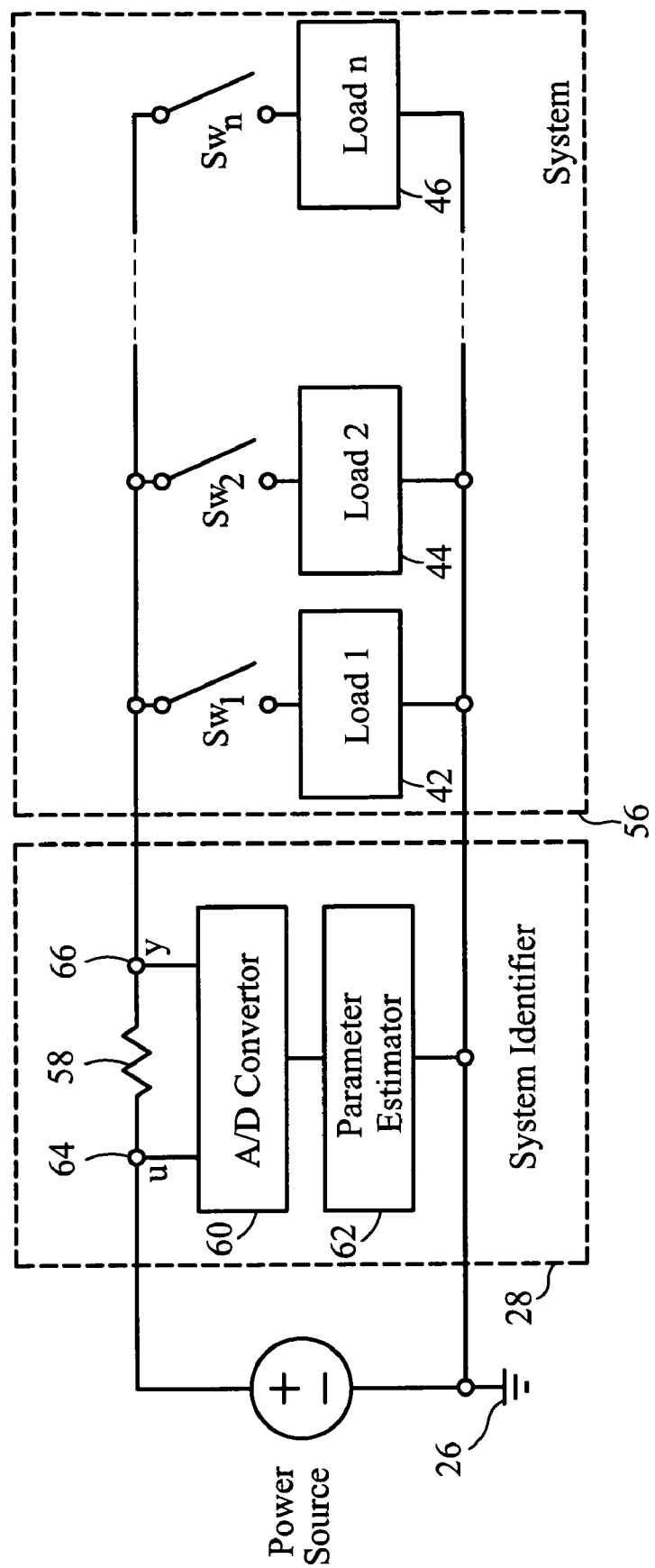
FIG. 5 depicts a configuration for acquiring digital voltage and current data representing a load.

FIG. 5 depicts a circuit for acquiring current and voltage data from one or more switched loads in order to perform parameter identification. Voltages are acquired from nodes 64 and 66 which lie on either side of a current shunt 58. The current shunt 58 is a current path having low, but nonzero, resistance. If current shunt 58 has an electrical resistance of R, then the current which passes through shunt 58 is $$I_{SHUNT} = \frac{V_{64} - V_{66}}{R} \quad (8)$$

where $V_{64}$ is the voltage at node 64 and $V_{66}$ is the voltage at node 66, with both voltages being measured relative to a common reference such as ground 26. Voltages $V_{64}$ and/or $V_{66}$ are converted into a digital form by an analog to digital converter 60. The digitally encoded voltage(s) are then used by parameter estimator 62 to update a model for system 56 which consists of one or more switched loads.

The core task of system identification is to determine a description that captures all of the features of interest in the system. In an electrical load, the features of interest are the load voltage and load current and the way that these two variables are related in time. Characteristic parameters such load impedance, power dissipation, and energy usage can be determined from the time histories of load voltage and load current. Less important features of an electrical load from the standpoint of electrical performance might be size or appearance and these features probably would not be represented in a description of the system. The key features of a system are often described with a system model. Such a model may be simply a record of voltages and currents over time, a model referred to as a nonparametric model. Nonparametric models are unwieldy. An easier type of model to use is a parametric model in which a model is given a well defined structure. The same model structure can represent many different systems with the distinction being the values of a finite number of model parameters. Such a model is known as a parametric model. Once an appropriate model structure is defined for a system, the problem of system identification reduces to a problem of estimating the model parameters. This is known as parameter estimation.

Figure 6:
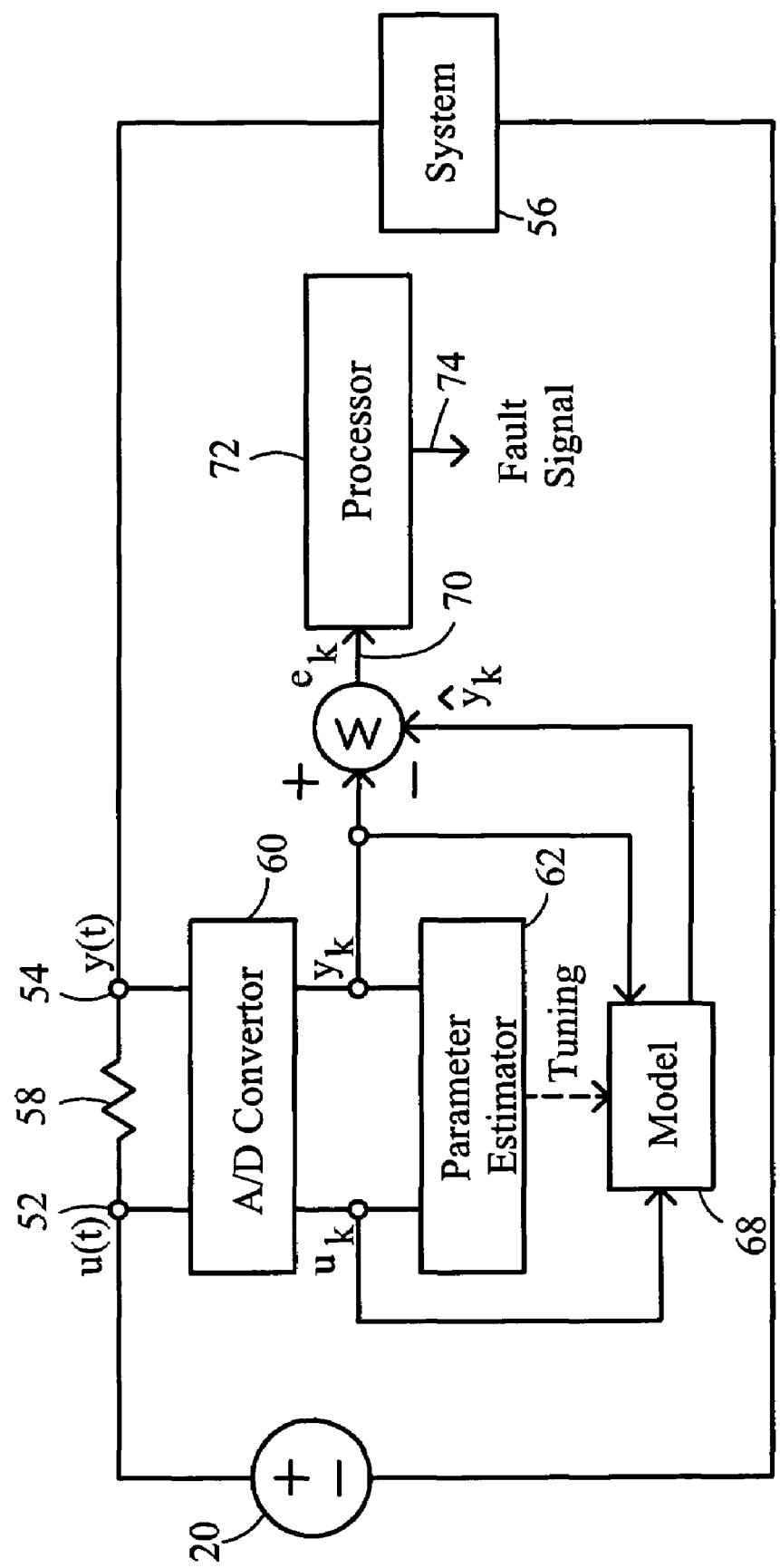
FIG. 6 portrays a model reference estimation system for fault detection.

FIG. 6 illustrates the model reference estimation approach to fault detection in an electrical network. Voltages u(t) and y(t) are continuous time voltages that are acquired from nodes 52 and 54. They are time dependent quantities. The A/D converter 60 samples the voltages u(t) and y(t) and converts them to digital signals $u_k$ and $y_k$, where the subscript k indicates which sample number. Samples are acquired at regular intervals separated by an amount of time T, known as the sampling time. So $$y_k = y(kT), \quad (9)$$

and a similar relationship exists for $u_k$. The parameter estimator 62 acquires samples of $u_k$ and $y_k$ and updates an estimate of the parameters in a model 68 of the system 56. The model 68 for system 56 can take many forms. One common type of model is called an ARX model which has the form $$y_k = a_1 y_{k-1} + a_2 y_{k-2} + \ldots + a_m y_{k-m} + b_1 u_{k-1} + \ldots + b_l u_{k-l} \quad (10)$$

where $y_k$ and $u_k$ are the $k^{th}$ measurements of time domain variables y(t) and u(t) respectively. From inspection of FIGS. 5 and 6 and reference to equation (8), it can be seen that measurements of y(t) and u(t) can be used to get load voltage and load current and can thus be used to completely specify the load. Models can have many parameters (eg: m and/or l are large numbers). However, often relatively low order models can successfully capture the relevant dynamics in a system. One popular model has three parameters $a_1$, $a_2$, $b_1$, a model known as the ARX(2,1) model. When $b_1=0$, the resulting model is known as a second order autoregressive model.

Recall that the system 56 represents one or more loads that may be engaged or disengaged at any particular time. Accordingly, system 56 may be changing in time, and so the model 68 for system 56 must be continually updated in order to remain valid. Since the model 68 will be assumed to be of fixed order, the problem becomes one of updating the parameters in the model 68. This is the role of the parameter estimator 62. At each sampling interval k, the parameters of model 68 are updated and then the revised model is used to generate an estimate of output $y_k$. The estimate is denoted as $\hat{y}_k$, where the "^" denotes estimate. The parameter estimator 62 may be based upon a recursive least squares algorithm as discussed in conjunction with equations (5) and (6), or it may be based upon a stochastic approximation approach as in equation (7), or it may be based upon any of a number of other parameter estimation algorithms that have been proposed for ARX systems.

The difference between the estimate and the actual output is a residual $e_k$ 70. If for sample k, the residual $e_k$ is small, then the model 68 is doing a good job of describing the system 56 for that sample. If for sample k, the residual $e_k$ is large, then the model is not doing a good job of describing the system 56 and the model parameters must be adjusted. Although not explicitly portrayed in FIG. 6, for most algorithms, the residual sequence 70 would be fed back into the parameter estimator 62 to be used in a parameter adjustment scheme. At any time that a new load is switched into or out of the system 56, the model 68 will not be able to fit the system 56, the residuals will be large, and the model parameters must be adjusted. Accordingly, when the residual sequence 70 is large, this can simply indicate that a change in the system 56 has occurred and that the model 68 must be adjusted. If the large residual sequence 70 is simply indicative of a changing but legitimate load, as the model 68 is tuned, the residual sequence 70 reduces in magnitude. However, if a parallel or a series arc fault occurs within system 56, it results in such chaotic changes in $y_k$ that the model is unable to accommodate the changes and is unable to generate a good estimate $\hat{y}_k$. This is evidenced in a residual sequence 70 that stays large. The role of processor 72 is to continually monitor the residual sequence 70 and then determine whether the pattern of the residuals corresponds to an arc fault. If so, it generates a fault signal 74 that can be used to trip a circuit interrupter or an alarm or otherwise provide some level of protection and/or indication.

One of the unique features of the FIG. 6 implementation is that it is very robust to the value of the current shunt 58. The value of the current shunt 58 is largely irrelevant so long as it is relatively stable. In fact, current shunt 58 can vary slowly over time without compromising performance. Since parameter estimation is taking place based upon measurements on either side of current shunt 58, if current shunt 58 changes its value by, say 10%, the parameter estimates in the model 68 will be adjusted accordingly in order to best describe the data set $y_k$ and to minimize the absolute values of the residual sequence 70.

When circuit interruption is added to arc fault detection to make an arc fault circuit breaker, some features of the circuit interruption mechanism can served double duty as a current shunt. For example, when a MOSFET based circuit breaker element is used, the resistance in the on position, the so-called $R_{ds\ on}$, can serve as the current shunt 58, avoiding the need for a dedicated shunt resistance.

As an example, actual data was collected using the FIG. 6 system. Samples were taken at nodes 66 and 68. The current shunt 58 that was used was a 70 milliohm resistance. Data was acquired using a 12 bit A/D converter at a sampling rate of 100 ksamp/sec. The model used was an ARX(2,1) model with initial parameter guess of $\theta_0$=col[0, 0,0]. A least squares identification was used with an initial covariance matrix of $P_0$=1000I. The results are depicted in FIG. 7.

Figure 7A:
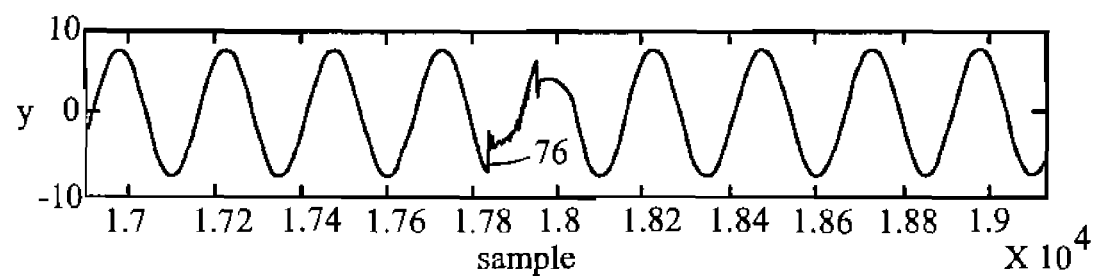
FIGS. 7A-7C show data collected from a guillotine arc fault.
Figure 7B:
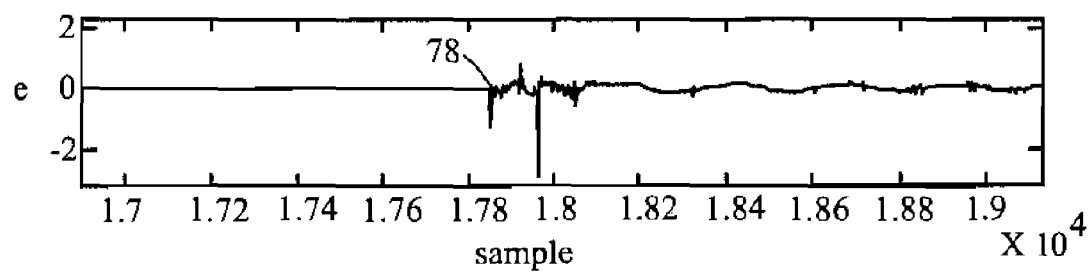
Figure 7C:
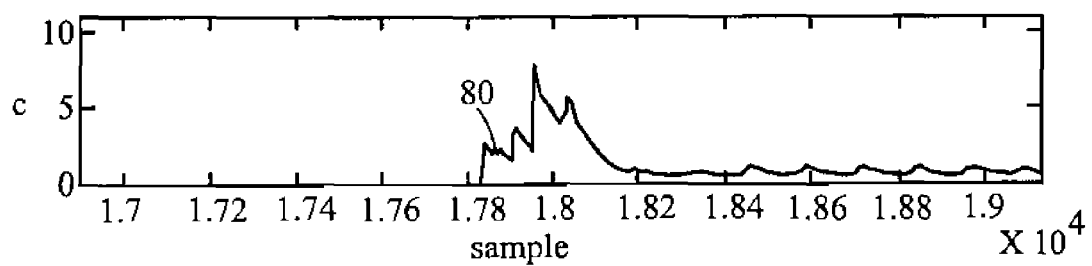

FIG. 7 depicts the acquired data from an arc fault experiment. The source is 115 VAC, 400 Hz. The load is a high resistance load. A razor blade is slowly brought in contact with the conductors connecting to the load. This is the so-called "guillotine test" defined in the SAE 5692 standard for arc fault interrupts. By very slowly lowering the blade, an intermittent "short" is applied across the conductors. This simulates the case of live electrical conductors having a voltage potential difference when they are pinched or cut by sharp metal edges, a common source of arcs. FIG. 7A depicts the acquired voltage data which corresponds to node 54 in FIG. 6. In FIG. 7A, an arc strikes is shown occurring at 76. FIG. 7B depicts the residual sequence 78 which is the difference between the actual measurement and the estimate. Prior to the occurrence of the fault, which occurs at point 76, parameter estimation results in very good estimates for the actual data. This is reflected by a low order residual sequence as seen in FIG. 7B for samples prior to about sample number 17,850. However, when an arc strikes 76, the model is unable to represent the data and as noted from FIG. 7B, the residual sequence 78 becomes large and relatively chaotic. It should be noted that the residual sequence 78 signals the presence of the struck arc within 100 microseconds of occurrence. In FIG. 7C, the processed sequence 80 is the means by which important features in the residual sequence 78 are identified. High magnitude values of residual 78 are indicative of a poorly fitting model. However, it is possible to obtain high magnitude residual values for certain legitimate loads (eg: switched loads) that are not associated with a fault. For this reason, the processed sequence 80 should reflect not only residual magnitude but duration as well. So, one way to process the residuals 78 is to integrate with a forgetting factor. An example of the processing algorithm is $$c(k)=\lambda c(k-1)+abs(e(k)) \tag{11}$$

where forgetting factor $\lambda$ serves to discount old measurements. The processing sequence 80 in FIG. 7C, was generated using a forgetting factor of 0.98. The choice of a threshold that signals a fault is somewhat arbitrary. A higher value means a longer interval between a fault occurrence and a fault recognition. A lower value risks an invalid arc decision (a nuisance trip).

Figure 8A:
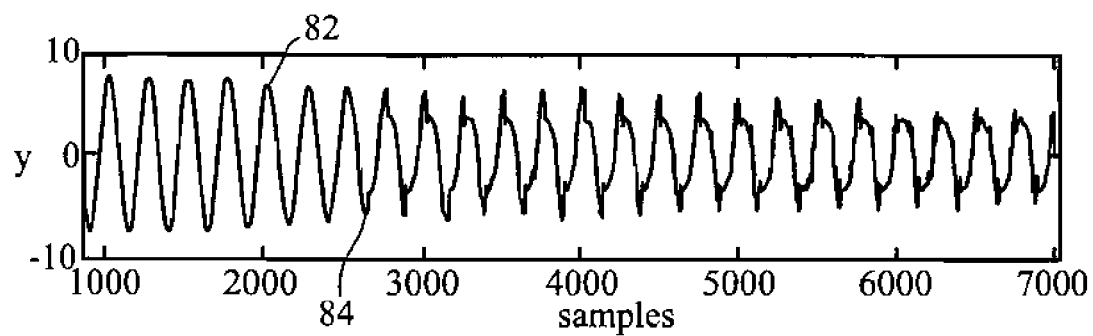
FIGS. 8A-8C depict the data, residual sequence and processed residuals from a carbonized arc fault.
Figure 8B:
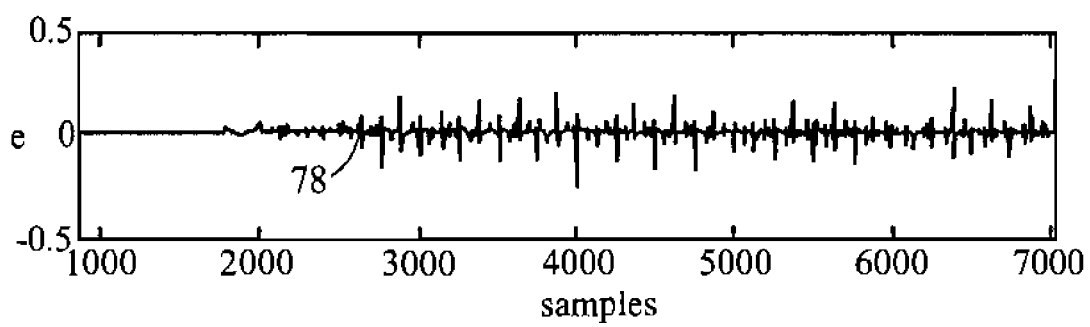
Figure 8C:
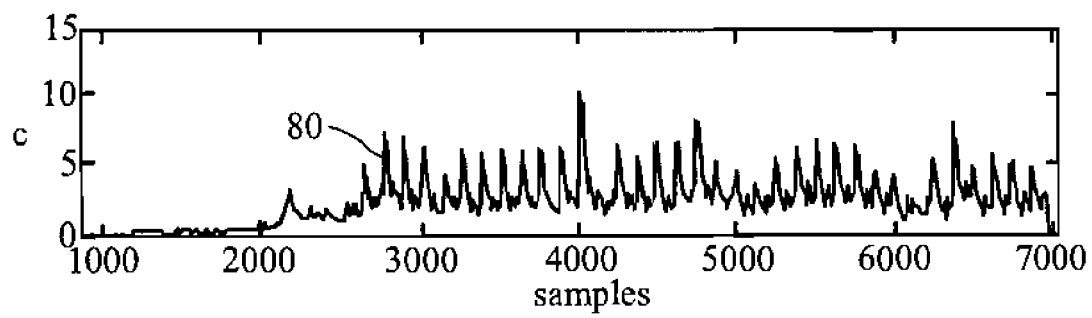

FIG. 8 depicts a detail of a parallel carbonized arcing fault. The test set-up is as described for FIG. 7. This time the wires connecting to the load have a carbonized path that has been prepared as described in Underwriters Laboratories UL 1699 specification. FIG. 8A depicts the acquired voltage data which corresponds to node 54 in FIG. 6. The first sign of leakage across the carbonized path is a reduction in amplitude 82. The first arc strike 84 is the first of repeated strikes due to the establishment of a plasma path. FIG. 8B displays the residual sequence 78. Processing this sequence 78 using equation (11) with a forgetting factor of 0.98 yields the processing sequence 80 in FIG. 5C which can be used to determine the presence of an arcing fault. For example, using a threshold of c=5 to signal an arc event will result in the detection of an arc within two to three cycles (5 to 7.5 milliseconds for a 400 Hz system) of the first occurrence of leakage.

Figure 9A:
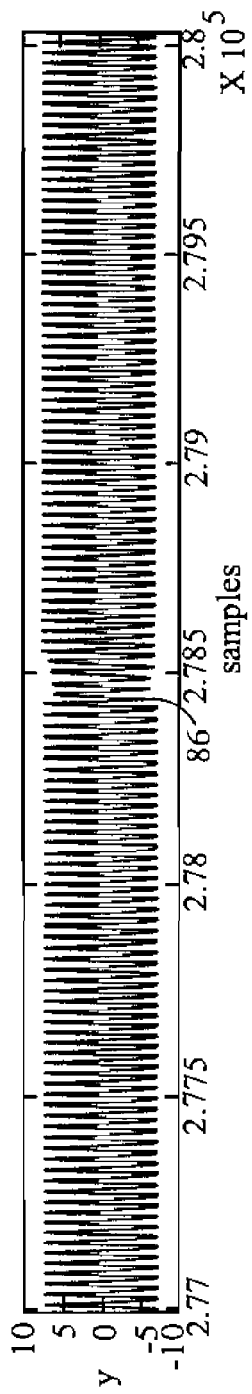
FIGS. 9A-9C depict the data from a non-fault switching power supply load.
Figure 9B:
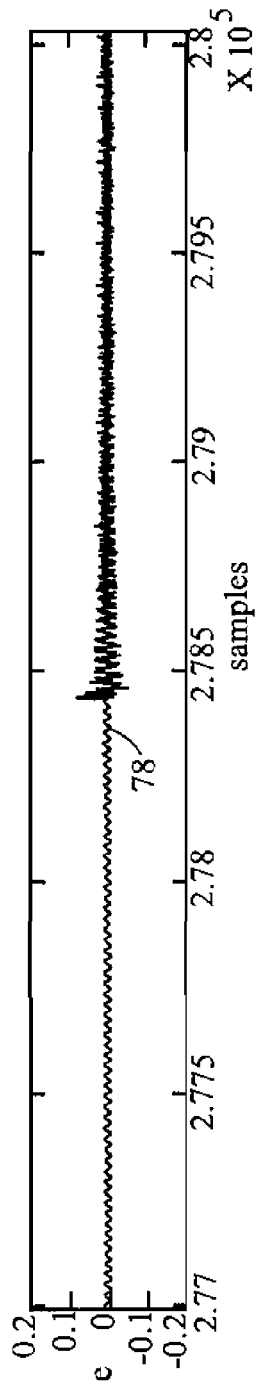
Figure 9C:
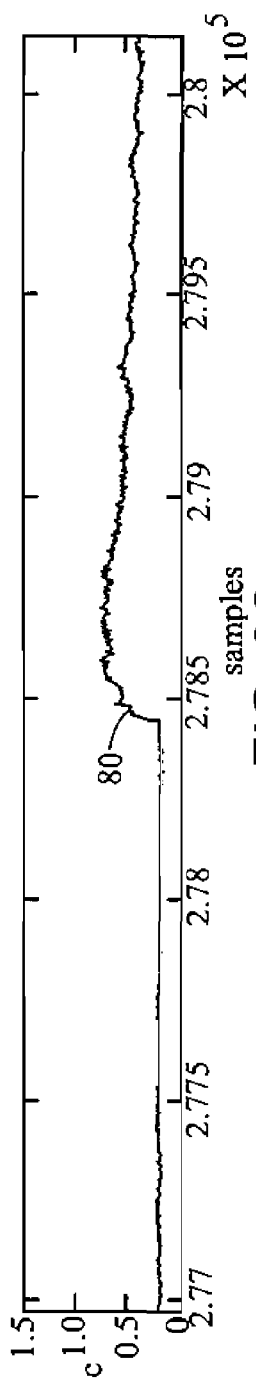

FIG. 9 depicts the turn-on of a switching power supply. This is a class of load that can fool traditional frequency domain based arc fault detection algorithms. When a switching power supply is turned on, it often draws high inrush currents. The transient behavior may take a number of cycles to die out so it can be troublesome for arc identification algorithms. FIG. 9A depicts the acquired voltage data which corresponds to node 54 in FIG. 6 from which it is noted that at the point 86 at which the switching power supply is turned on, there is a dip in measured y, due to inrush current. The transient behavior then takes several cycles to die out. In FIGS. 9B and 9C, it is noted that the values of the residuals 78 and processed residuals 80 do not show the same magnitude as the arc faults in FIGS. 7A and 7B, and FIGS. 8A and 8B, because the change in these quantities is more regular and can be accommodated by the model reference approach of the present invention. As seen from comparing FIG. 9C to FIGS. 7C and 8C the, value of the processed sequence is substantially lower than values obtained from arcing faults and does not result in an arc detection.

FIG. 10 depicts the results from a load comprising a dimmer circuit set to worst case (50%) setting with a 200 watt incandescent lamp. Conventional dimmers work by a phase delayed turn on of a solid state element. At half power, this creates high level transients at the peak of each half cycle. This is most pronounced for the first application of power since the lamp filament is cold (low resistance) and this results in high current flow until the filament heats up. FIG. 10A depicts the acquired voltage data which corresponds to node 54 in FIG. 6. The sample at which the dimmer is engaged is noted as 88 and in FIG. 10B a corresponding high level of chaotic behavior is observed on the residual sequence 78. In FIG. 10C, the filtered residuals 80 are not on the same order of magnitude as for the arcing faults depicted in FIG. 7C and FIG. 8C and so the proposed algorithm does not misdiagnose a dimmer load as an arc fault.

FIG. 11 depicts a carbonized arc fault which occurs for a DC source constructed from series connected lead acid batteries yielding an effective DC supply of 270 VDC with a source impedance of 465 milliohm. Scaled voltage measurements are obtained from either side of a 70 milliohm current shunt and fed to a 12 bit analog to digital converter which is sampling at 100 KHz. The model that is used is an ARX(2, 1) model. A current limiting resistance of 9.8 ohms is added in series with the DC supply to limit short circuit current. A carbonized fault is constructed from twin leaded polyvinyl chloride insulated 16 gauge wire. The carbonized fault is prepared according to the specification in section 53.6 in the Underwriters Laboratories 1699 standard. A series switch allows the carbonized fault to be applied. FIG. 11A depicts the sensed shunt voltage. In FIG. 11A the carbonized fault is engaged as shown at 90, causing a droop in the voltage at the shunt. A highly chaotic fault 92 is then observed which is reflected in FIG. 11B as a chaotic residual sequence 78 and is reflected in FIG. 11C as a chaotic processed residuals sequence 80. A certain threshold perhaps 4, of the processed residuals, can be used to trigger a fault. As for the AC case, this threshold is somewhat arbitrary but is chosen as a compromise between being able to quickly identify arcing faults and being immune to nuisance trips. Different thresholds for fault recognition are appropriate for DC versus AC arc detection.

Figure 12:
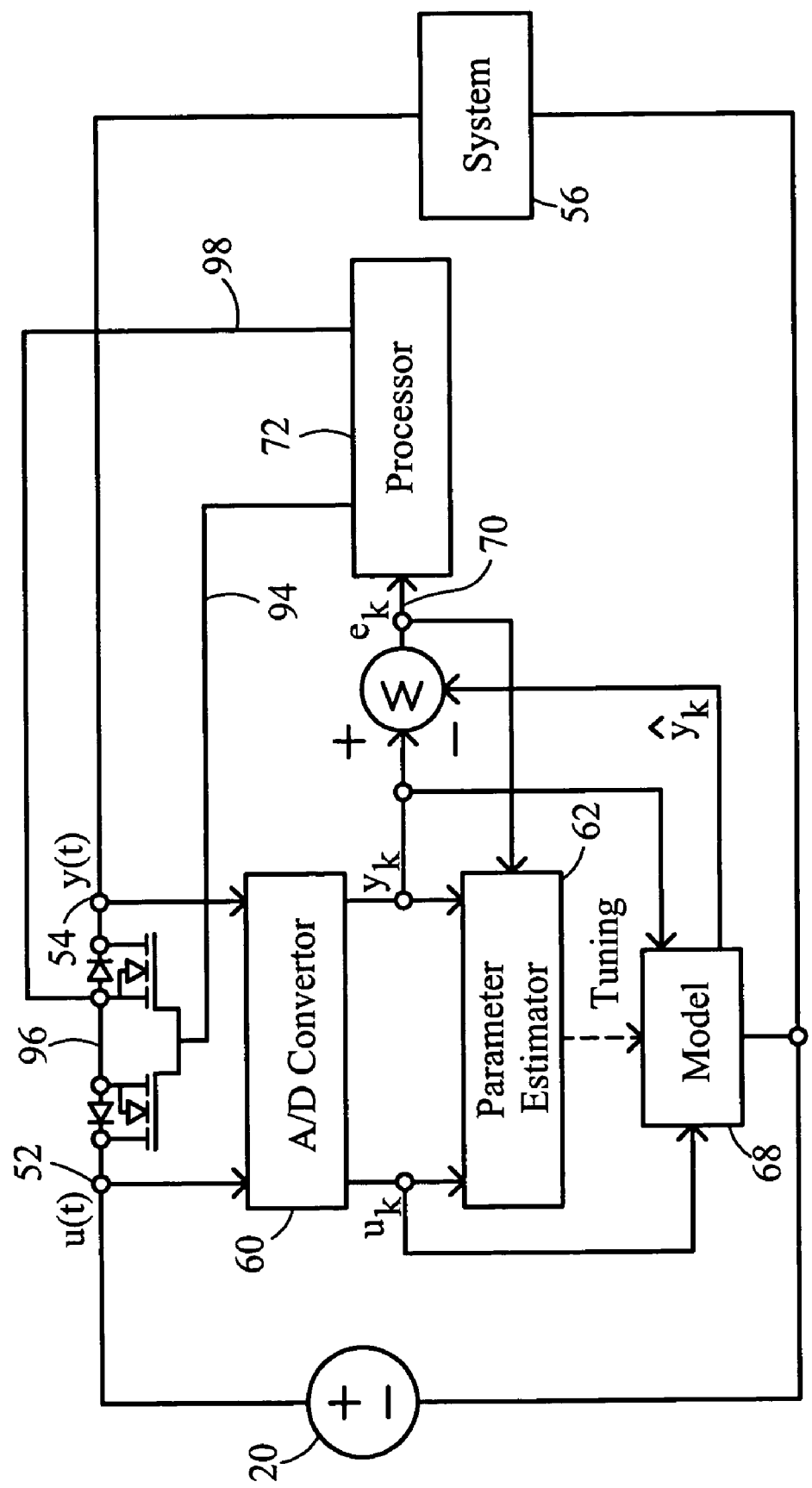
FIG. 12 depicts an arc fault protection circuit that utilizes a solid state switch for interruption.

FIG. 12 depicts an arc fault protection circuit that utilizes a solid state switch for interruption after a fault is detected. A solid state switch 96, which is depicted in FIG. 12 as being composed of back-to-back N channel MOSFET transistors, is positioned between nodes 52 and 54. The solid state switch 96 is controlled by a signal 94 coming from processor 72. When signal 94 has a voltage that is above the potential at line 98 by a certain amount, it serves to turn on the solid state switch 96, causing the path between nodes 52 and 54 to have a very low (but nonzero) resistance. When signal 94 has the same potential as the potential at line 98, it serves to turn off the solid state switch, causing the path between nodes 52 and 54 to have a very high resistance and inhibiting current flow to the system 56. For the configuration depicted in FIG. 12, if the solid state switch 96 is on, the electrical path between nodes 52 and 54, which goes through the solid state switch 96, will have a resistance value of $2R_{dson}$ where $R_{dson}$ is the so-called drain to source resistance of a single MOSFET and the factor of 2 reflects the fact that two series connected MOSFETs are used to make the solid state switch depicted in FIG. 12. The solid state switch 96 in FIG. 12 serves a double duty. First, it acts as the means to interrupt current delivery into a faulted system when an arcing fault is detected. Second, it serves the role of a current shunt which is needed for effective parameter estimation. A MOSFET, also known as a metal oxide field effect transistor, is one type of solid state switching element, but other types of switching elements are available, including bipolar junction transistors, thyristors, relays and circuit breakers, any of which could be used to control power to the system 56.

Figure 13:
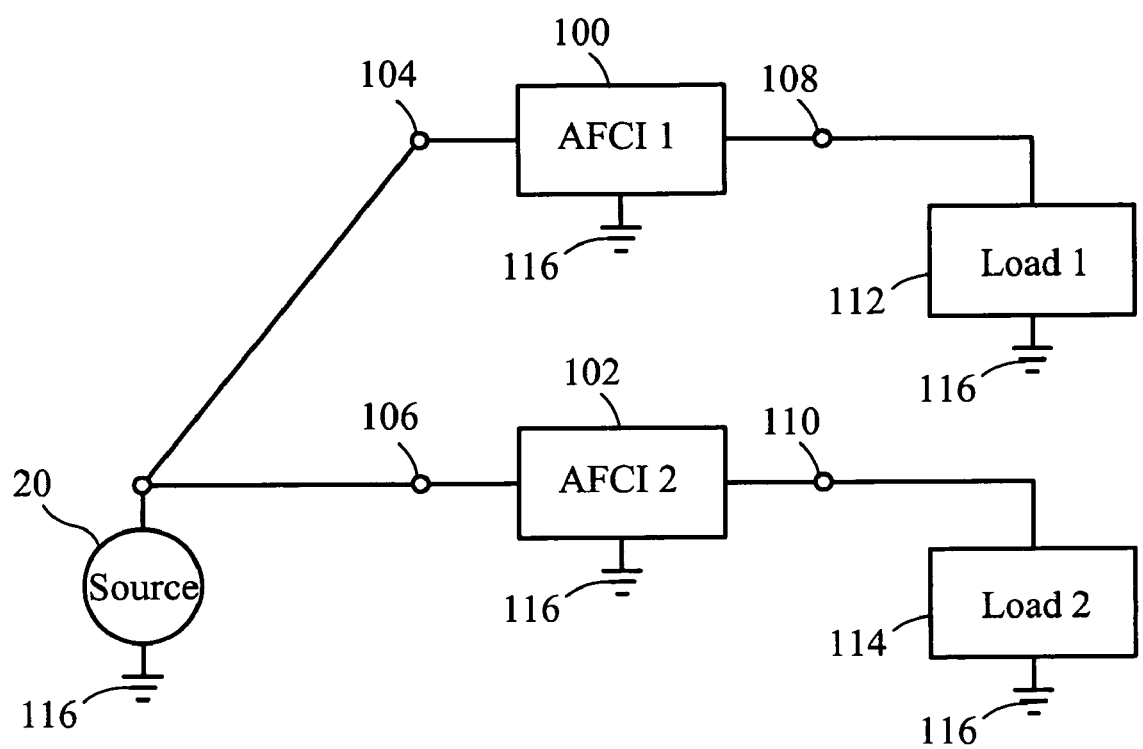
FIG. 13 depicts the distinction between source and load side faults.

FIG. 13 depicts the problem of distinguishing load side faults from source side faults. Two electrical branches are depicted, both receiving power from source 20. Power source 20 and loads 112 and 114 all connect to a circuit common 116 which represents a return path for current flow. This may represent the aircraft frame in an aviation application or might represent grounded conductors (neutrals) in a terrestrial application. Arc fault circuit interrupters 100 and 102 serve to protect their respective branches and incorporate arc fault detection and interruption. Possible arc fault locations are represented by the nodes 104,106,108 and 110. These are locations where either a parallel arc fault to circuit common 116 or another conductor could occur, or a series arc fault could occur. It should be noted that a parallel arc fault at node 104 is electrically equivalent to a parallel arc fault at node 106 but a series arc fault at node 104 is electrically distinct from a series arc fault at node 106.

For series faults, by interrupting current flow to the load, a given arc fault circuit interrupter can effectively protect against series faults that are anywhere in electrical series with that arc fault circuit interrupter. For example, the lower arc fault circuit interrupter 102 can be used to eliminate arcing current from a series fault that occur at either of nodes 106 and 110. When using a system identification technique that uses a current shunt as depicted FIG. 6, only series arcs that are in electrical series with the shunt will be sensed and since activating a series circuit interruption means will eliminate the arcing current, it is not necessary to identify the location of the series arc fault.

For parallel faults, a circuit breaker must be situated between the source and the fault in order to be able to interrupt the power delivery to that fault. As such, the upper arc fault circuit interrupter 100 can only interrupt power to parallel faults on the side corresponding to the load 112, for example at location 108, and cannot interrupt parallel faults that occur at nodes 104, 106 or 110. In a similar way, the lower arc fault circuit interrupter can only interrupt power to parallel faults on its load side, for example, faults that occur in a location corresponding to node 110. When using the system identification/model estimation technique of this invention to detect an arc, it may be necessary to add a second test to confirm that the fault is interruptible. One approach is to perform two parallel identifications. One is based upon an autoregressive time domain model of voltage at the load side of the shunt (that is, node 54 in FIG. 6), and the second is based upon an autoregressive time domain model based upon load current. At any time that with both models, the estimation errors become large for a number of samples, this indicates a load side arc.

Figure 14:
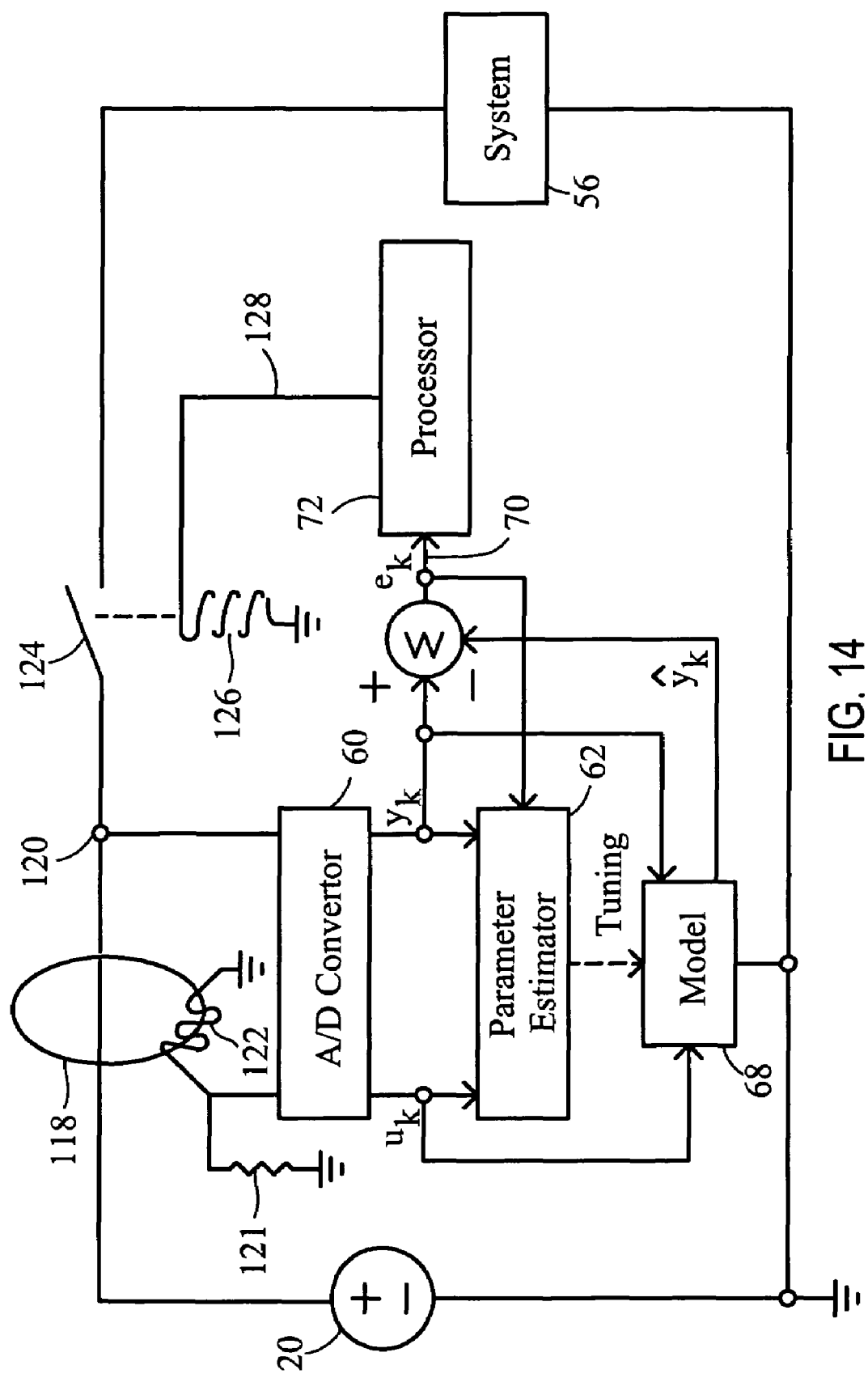
FIG. 14 depicts a circuit breaker based arc fault circuit interrupter that uses a current transformer for sensing branch current.

FIG. 14 depicts an alternative method for taking measurements that avoids the need for a current shunt. By using a transformer 118 coupled into the electrical branch of interest, current measurements may be made by using a scaled current. The branch serves as the primary for torroidal transformer 118 as it passes through the center for an effective single primary turn. Transformer secondary 122 develops a current that is proportional to the branch current through a turns ratio. A loading resistor 121 serves to transform current to a voltage. This voltage is sampled along with the voltage from node 120 by the A/D converter 60 and is then processed to determine the presence or absence of an arcing fault. If an arcing fault is detected, circuit breaker 124 is driven to be in a latched open position by solenoid actuator 126, thereby removing power from the faulted branch. Although the current and voltage sense elements are depicted in FIG. 14 as occurring on the source side of circuit breaker 124, in some embodiments, it may be preferable to locate these elements on the load side of circuit breaker 124. It should be noted that the voltage at node 120 will not be identical to the source voltage, but will differ by a small resistive drop across wiring and the internal resistance of source 20. As such, measurements of the voltage at node 120 can give valid system information that can indicate the presence or absence of a fault. In some embodiments, it may be desirable to replace circuit breaker 124 with a relay, the distinction being that a circuit breaker is normally latched in a closed position and is driven to a latched open position, while a relay may be controlled to be in an open or a closed state.

Figure 15:
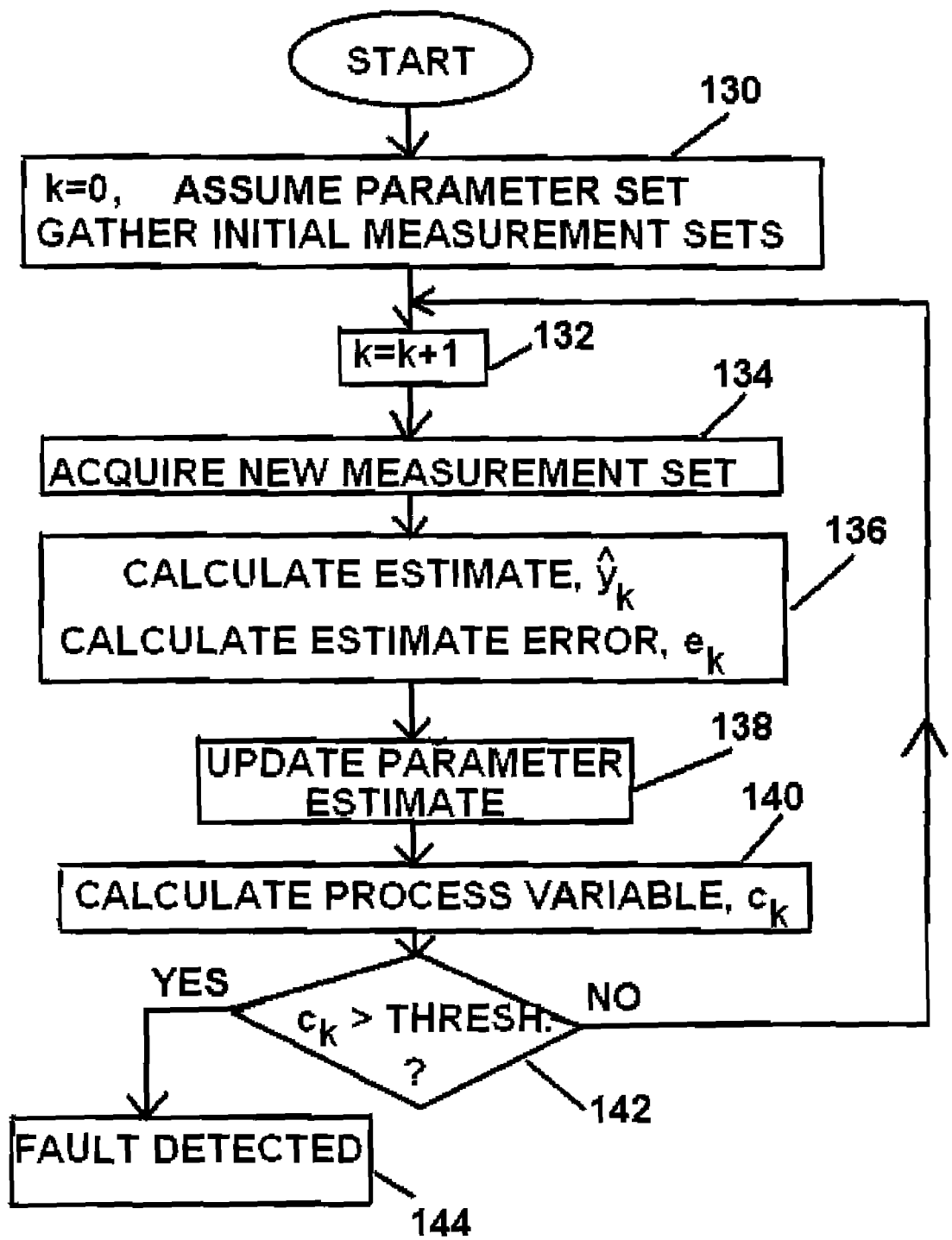
FIG. 15 is a flow diagram of the preferred method of the invention.

FIG. 15 depicts a flowchart describing the sequence of operations that are used in the arc detection approach of the present invention. The first action that is taken 130 is to initialize the index k to be zero and to gather an initial set of measurements of voltages and/or currents that will be used in the autoregressive model and to assume an initial vector of model parameters $\Theta_0$. The index, k, is incremented 132, and a new measurement set, the $k^{th}$ set, is acquired 134. Based upon the $k^{th}$ measurement set, an estimate of the parameter y at sample k may be made 136 using equation (4) with the parameter estimate $\Theta_{k-1}$. Then an estimate error (residual) $e_k$ may be computed 136 as the bracketed term in equation (6). An update of the parameter estimate 138 is made using (for the case of stochastic approximation) equation (7). Then a process variable $c_k$ is calculated 140 using equation (11). This variable is compared 142 against a threshold to determine the presence of an arcing fault. If $c_k$ exceeds the threshold then this is recognized as a fault 144 and a control action may be taken. The control action could be to set off an audio or visual alarm, to energize a circuit interrupter to remove power from the faulted branch, and/or to manage the fault condition in some manner. Alternatively, if $c_k$ is less than the threshold, then there is no fault detection, the sample index k is incremented 132 and the process repeats.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents.

What is claimed is:

1. An apparatus for arc fault identification in an electrical distribution network, said apparatus comprising:
   a load model generator that is continuously updating a time domain load model attempting to match the output from said time domain load model to measured signals from the electrical distribution network, wherein said load model generator employs a load model of a fixed order and the parameters of said load model are estimated based upon measurements of voltages on one or both sides of a shunt resistance; and
   a signaling unit that reports an arc fault when said load model generator is unable to match the output from said load model to the measured signals.

2. The apparatus of claim 1 wherein the measured signals comprise one or more of the quantities of voltage and current.

3. The apparatus of claim 1 additionally comprising a unit employing the measurements of voltages to identify the location of an arc relative to said shunt resistance.

4. The apparatus of claim 1 wherein said time domain load model is an autoregressive load model.

5. The apparatus of claim 1 additionally comprising means to remove power from said electrical distribution network upon reporting of an arc fault, thereby providing arc fault protection.

6. The apparatus of claim 5 wherein said means to remove power comprises a solid state switch.

7. The apparatus of claim 6 wherein said solid state switch is also used as a shunt resistance.

8. The apparatus of claim 5 wherein said means to remove power comprises an interruption device selected from the group consisting of transistors, thyristors, relays, and circuit breakers.

9. An apparatus for the identification of faults in an electrical system, said apparatus comprising:
   a system modeling device operating in time domain;
   wherein the inability of said system modeling device to model the electrical system within a predetermined residual threshold causes a report of an electrical arcing fault; and
   wherein said system modeling device employs a time domain model, estimates the parameter values for the time domain model, uses the time domain model to devise an estimate of the electrical system output, computes an estimate error, and uses said estimate error to revise said parameter values estimate.

10. The apparatus of claim 9 additionally comprising means to remove power from the electrical system upon said report of an electrical arcing fault.

11. The apparatus of claim 9 wherein an estimate error that is large for many consecutive measurements is treated as said inability to satisfactorily model the electrical system.

12. A method for the identification of faults in an electrical system, the method comprising the steps of:
   providing a system modeling device operating in time domain, wherein the system modeling device employs a time domain model, estimates the parameter values for the time domain model, uses the time domain model to devise an estimate of the electrical system output, computes an estimate error, and uses the estimate error to revise the parameter values estimate;
   monitoring the system modeling device for an inability to model the electrical system within a predetermined residual threshold; and
   reporting an electrical arcing fault upon detection of such inability.

13. The method of claim 12 additionally comprising the step of removing power from the electrical system upon the report of an electrical arcing fault.

14. The method of claim 12 wherein an estimate error that is large for many consecutive measurements is treated as the inability to satisfactorily model the electrical system.

* * * * *